United States Patent [19]
Cohen

[11] Patent Number: 5,557,137
[45] Date of Patent: Sep. 17, 1996

[54] VOLTAGE PROGRAMMABLE LINK HAVING REDUCED CAPACITANCE

[75] Inventor: Simon S. Cohen, Burlington, Mass.

[73] Assignee: Massachusetts Institute of Technology, Cambridge, Mass.

[21] Appl. No.: 210,062

[22] Filed: Mar. 16, 1994

Related U.S. Application Data

[63] Continuation of Ser. No. 949,891, Sep. 23, 1992, abandoned.
[51] Int. Cl.[6] .......................... H01L 29/00; G11C 17/00
[52] U.S. Cl. .................... 257/530; 257/529; 257/538; 257/532; 365/94; 365/96
[58] Field of Search ....................... 257/68, 71, 529, 257/532, 538, 530; 365/94, 96

[56] References Cited

U.S. PATENT DOCUMENTS

| | | | |
|---|---|---|---|
| 4,424,578 | 1/1984 | Miyamoto | 365/104 |
| 4,458,297 | 7/1984 | Stopper et al. | 361/463 |
| 4,481,283 | 11/1984 | Kerr et al. | 430/319 |
| 4,585,490 | 4/1986 | Raffel et al. | 148/1.5 |
| 4,758,745 | 7/1988 | El Gamal et al. | 307/465 |
| 4,823,181 | 4/1989 | Mohsen et al. | 257/530 |
| 4,843,034 | 6/1989 | Herndon et al. | 437/189 |
| 4,847,732 | 7/1989 | Stopper et al. | 361/395 |
| 4,876,220 | 10/1989 | Mohsen et al. | 431/170 |
| 4,881,114 | 11/1989 | Kohsen et al. | 257/530 |
| 4,899,205 | 2/1990 | Handy et al. | 257/530 |
| 4,910,417 | 3/1990 | El Gamal et al. | 307/465 |
| 4,943,538 | 7/1990 | Mohsen et al. | 437/52 |
| 5,070,384 | 12/1991 | McCollum et al. | 257/530 |
| 5,087,589 | 2/1992 | Chapman et al. | 437/195 |

FOREIGN PATENT DOCUMENTS

| | | |
|---|---|---|
| 0416903 | 3/1991 | European Pat. Off. . |
| 0452091A2 | 10/1991 | European Pat. Off. . |
| 0452090A2 | 10/1991 | European Pat. Off. . |
| 2222024 | 2/1990 | United Kingdom ............ 257/530 |

OTHER PUBLICATIONS

Mansfield et al., Development of "Stainless Aluminum", Electrochem. Soc. vol. 138, No. 12 (Dec. 1981).

Chiang et al., Oxide–Nitride–Oxide Antifuse Reliability, (1990) IEEE. I.R.P. Symp. 186.

Herndon et al., Multilevel Interconnect Planarization by Voltage and Laser Programmable Links Using Ion Implantation, (1989), IEEE VLSI Conf.

Kakkawa et al., Comparison of Refractory Metal and Silicide Capping Effects on Aluminum Metallizations. VMIC Conf. 463 (1989).

Handy et al., Dielectric Based Antifuse for Logic and Memory ICs. 88 IEEE Int'l Electronic Device Meeting 786 (1988).

Brown et al., Reduction of Hillock Growth on Aluminum Alloys, Proc. Fourth Int'l IEEE VLSI Conf. 426 (1987).

Shen et al., A Highly Reliable Aluminum Metallization For Micron and Submicron VLSI Applications, (Jun. 9–10, 1986) V–MIC Conf. 191.

(List continued on next page.)

*Primary Examiner*—Robert P. Limanek
*Assistant Examiner*—Valencia Martin Wallace
*Attorney, Agent, or Firm*—Hamilton, Brook, Smith & Reynolds, P.C.

[57] ABSTRACT

A voltage programmable link structure reduces parasitic capacitance by using ion implantation. The voltage programmable link structure includes a first conductive element placed over a substrate. A transformable insulator is deposited over the first conductive element. The transformable insulator material is deposited with an ion implanted layer. A second conductive element is deposited over the ion implanted layer. An electrical path is formed between the first and second conductive elements by applying a voltage between the elements across at least one region of the insulator, such that the insulating material is transformed and rendered conductive to form an electrical signal path.

13 Claims, 5 Drawing Sheets

OTHER PUBLICATIONS

Gardner et al., Layered and Homogeneous Films of Aluminum and Aluminum/Silicon with Titanium Zirconium, and Tungsten for Multilevel Intercon.

Stopper et al., Session XVIII: Modeling and Technology, 1985, IEEE Int'l Solid–State Circuits conf. 268.

El–Ayat et al., A CMOS Electrically Configurable Gate Array, vol. 24, No. 3, Solid–State Circuites, pp. 752–762 (1989).

Brian Cook et al., "Amorphous Silicon Antifuse Technology for Bipolar PROMS," Bipolar Circuits and Technology Meeting, IEEE, pp. 99–100 (1986).

Fujitsu KK, "Preparation of Semiconductor Device", *Patent Abstracts of Japan*, (1983) (Abstract No. JP58070552).

Nippon Denki KK, "Manufacture of Semiconductor Integrated Circuit Device", *Patent Abstracts of Japan*, (1984) (Abstract No. JP59011669).

Fujitsu KK, "Manufacture of Semiconductor Device", *Patent Abstracts of Japan*, (1984) (Abstract No. JP59129442).

VOLTAGE PROGRAMMABLE LINK HAVING REDUCED CAPACITANCE

Government Funding

This invention was made with government support under Contract Number F19628-90-C-0002 awarded by the Air Force. The government has certain rights in the invention.

This application is a continuation of application Ser. No. 07/949,891, filed Sep. 23, 1992, now abandoned.

Related Applications

This application is related to U.S. patent application Ser. No. 07/860,678, filed Mar. 30, 1992, U.S. patent application Ser. No. 735,472, filed Jul. 25, 1991, and U.S. patent application Ser. No. 07/918,568, filed Jul. 22, 1992, all of which are incorporated herein by reference.

BACKGROUND OF THE INVENTION

This invention is related generally to solid state integrated circuit fabrication and more particularly, to methods for fabricating voltage programmable link structures.

Programmable conductive paths, particularly "links" between two or more distinct conductive layers, are increasingly employed in solid-state integrated circuit fabrication to produce a wide variety of programmable circuits including, for example, field programmable gate arrays ("FPGAs"), programmable read only memories ("PROMs"), and other programmable electronic devices. Typically, these devices are "programmed" by applying an electrical voltage to trigger an "antifuse" link structure between two conductive layers that are separated by an insulator to establish an electrical connection therebetween.

While this approach permits an almost limitless variety of custom circuits, certain factors make programmable devices difficult to implement. To be useful, the link structures must remain insulating at the normal operating voltage for solid state devices (e.g., nominally five volts), but must reliably "break down," or respond, to a programming voltage which is higher than the normal operating voltage. Typically, the programming voltage should be no more than about fifteen volts so that other structures on the circuit are not damaged.

If a link structure breaks down at a voltage below the programming voltage (or breakdown voltage), an unintended altered circuit will result, thereby disturbing the normal operation of the existing circuit. On the other hand, if the programmable link structure is over-resistant to the programming voltage, either the conductive path will not be formed when desired, or greater voltages must be applied with the attendant risk of damage to nearby structures on the wafer.

One way to implement a voltage programmable link structure is to use two levels of metallization agents and a composite insulator made of a deposited silicon oxide film interposed between two like films of silicon nitride. The insulator stack is deposited over the first metal and then a thin film of aluminum (in the order of 20 nm) is deposited over the insulator to protect it from etchants in a subsequent step. Next, the thin film of aluminum is patterned by etching to form patches which define potential links, and then a dielectric is deposited thereover. A portion of the dielectric is then removed over the patches, and the remainder of second metal element is deposited in the removed portion.

One problem with this approach is that the thin aluminum film deposited over the insulator has to be patterned by etching in order to keep individual links isolated. This etching process is a rather delicate matter. For example, a dry or wet etch must be strictly controlled or else the thin insulator stack will be damaged, causing a possible short between the first and second metals.

Another problem is that misalignment of the aluminum layer patches and the second metal element can result in etching of the transformable insulation layer and a short between the two metal layers. To prevent the misalignment and accompanying short from occurring, the patch must be made considerably larger than the link area. However, since the size of the patch and parasitic capacitance are linearly related, a larger patch would be accompanied by a large parasitic capacitance. Parasitic capacitance is a problem because it slows the speed of the integrated circuit and prevents it from operating efficiently.

Furthermore, it is important that the voltage programmable link structure be able to meet the expected requirements for the next generation of FPGAs (e.g., 0.8 µm). It is expected that the alignment tolerance for the next generation of FPGAs will be about 0.2 µm, so an actual 0.8×0.8 µm² link structure would require an increase in area equal to about 1.2×1.2 µm². The increase in size results in an increase in parasitic capacitance. Thus, there is also a need for a voltage programmable link structure that can meet the expected requirements for the next generation of FPGAs without having an increase in parasitic capacitance.

SUMMARY OF THE INVENTION

The present invention provides a voltage programmable link structure and a method for fabricating the link without having to etch the initial layer of the second metallization element. Instead of delineating the initial layer with etched patches, the present invention uses ion implantation to form a patched surface of conductive regions surrounded by nonconductive regions. The ion implanted layer serves as an etch stop larger than the conductive region when opening a contact hole in the dielectric and provides conductive patches for linking the two metal layers. An advantage of this structure is that problems associated with misalignment between the bulk of the second metal element and the conductive patches are greatly reduced. Also, parasitic capacitance is minimized because the size of the patches can be designed to offset the parasitic capacitance. The first metal layer of the second metal element is preferably made of aluminum but may also be of other materials such as amorphous or polycrystalline silicon.

Thus, in accordance with one embodiment of the present invention, there is provided a voltage programmable link structure that includes a first conductive element deposited over a substrate. A transformable insulator is deposited over the first conductive element. Deposited over the transformable insulator is a conductive layer which is ion implanted to form nonconductive regions around conductive link patches. An insulating dielectric layer is formed over the ion-implanted layer and etched to expose the patches. A second conductive element is deposited within the etched regions over the conductive link patches. At least one conductive path is formed when a voltage is applied between the first and second conductive elements across the insulator material.

The ion implanted conductive layer is preferably an aluminum material of about 200 Å. The aluminum layer is implanted with either nitrogen or oxygen ions, resulting in an aluminum nitride (AlN) or an alumina (Al$_2$O$_3$) surface, respectively. These surfaces are impervious to commonly used etchants making it an excellent continuous etch stop. This property is important in opening a window in the dielectric insulator for exposing the conductive link patches.

Before the aluminum layer is ion implanted, a photoresist is placed over aluminum to serve as a mask. A portion of the photoresist is removed using conventional photolithographic techniques and the remaining portion of the photoresist is used to mask the aluminum surface from the ions. After the ion implantation is finished, the photoresist is removed. The resulting structure is a patched surface of either aluminum nitride (AlN) or alumina (Al$_2$O$_3$) except where the photoresist served as a mask. The portion of the surface that was masked from the ions defines a conductive patch. The full layer is used as an etch stop and the patches serve in establishing links between the first and second conductive elements.

The first and second conductive elements are preferably metallization layers that are comprised of varying compositions. For example, the conductive elements may be a non-refractory material, wherein the non-refractory material as described in U.S. application Ser. No. 07/860,678, is aluminum. In another embodiment, the conductive elements may be a refractory material selected from a group comprising metals, refractory metal alloys, refractory metal nitrides and refractory metal silicides. Preferably, the refractory material is selected from a group comprising refractory material is selected from a group comprising molybdenum, titanium and tungsten.

Yet another metallization layer is that of modified non-refractory material such as formed by titanium or molybdenum diffused into aluminum as described in U.S. application Ser. No. 735,472.

The transformable insulator material is preferably a silicon oxide insulator sandwiched between layers of silicon nitride. The silicon nitride layers serve as a protective barrier against the conductive elements. This minimizes the chance of chemical reactions degrading the structure over a period of time.

After the formation of the above structure, conductive links are formed by applying a predetermined voltage. The predetermined voltage is typically greater than 7 volts but less than 15 volts, preferably on the order of about 7.5 to about 12.5 volts, and most preferably on the order of about 8.5 to 10.5 volts. The application of this voltage results in localized dielectric breakdown and formation of a conductive path.

While the present invention will hereinafter be described in connection with a preferred embodiment and method of producing, it will be understood that it is not intended to limit the invention to these embodiments. Instead, it is intended to cover all alternatives, modifications and equivalents as may be included within the spirit and scope of the present invention as defined by the appended claims.

DETAILED DESCRIPTION OF THE INVENTION

Figure 1:
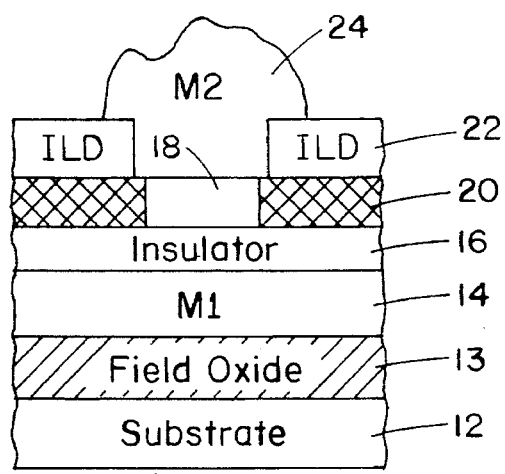
FIG. 1 is a sectional view of a voltage programmable link structure according to the present invention.

In FIG. 1, a voltage programmable link structure 10 is shown formed upon a substrate 12 (which can be a field insulator or an active device layer of an integrated circuit wafer). The link 10 further includes a field oxide layer 13 deposited over the substrate, a first metallization layer (M1) 14 deposited over the field oxide layer, a transformable insulator link material 16 deposited over the first metal layer, a thin film of an ion implanted conductive material (i.e., aluminum) 20 deposited over the insulator link material, an interlevel dielectric material 22 deposited over a portion of the ion implanted layer, and a second metallization layer (M2) 24 deposited over the interlevel dielectric material.

In one embodiment, the first and second metallization layers are made entirely from a refractory conductive material such as refractory metals, refractory metal alloys, refractory metal nitrides, and refractory metal silicides. More specifically, molybdenum, titanium, and tungsten are suitable for the present invention.

In a second embodiment, the first and second metal layers are made from a modified aluminum. In its simplest form, modified aluminum is formed by depositing an aluminum layer on substrate 12, followed by deposition of a thin (e.g., less than about 50 nm) refractory conductive layer. The wafer is then sintered to form an intermetallic compound.

In a third embodiment, the first and second metallization layers are three layer structures which are mirror images of each other. Each includes a first layer of a non-refractory conductive material, such as aluminum (1% silicon), and a capping of about 10–50 nanometers of refractory conductive material such as titanium. The refractory material diffuses into the aluminum to prevent the first and second metal layers from having marked surface irregularities known as "hillocks" that occur during sintering and other device processing steps. These hillocks will pierce and damage adjacent insulator layers unless such insulator layers are made rather thick (e.g., greater than 500 nanometers). The first and second layers each have a final layer, such as 10–50 nanometers of aluminum (1% silicon) to prevent interaction with the transformable insulating layer. For more details on the hillocks, reference is made to U.S. patent application Ser. No. 07/918,568, filed Jul. 22, 1992, which is herein incorporated by reference.

Once the first conductive element has been formed, it is overlaid with the transformable link insulator material 16 at least at each programmable link site. The link material is preferably a silicon oxide insulator and can also include one or more other insulating layers to physically separate the silicon oxide from the first and second conductive elements. In the preferred embodiment, silicon nitride layers sandwich the silicon oxide layer to protect it from the metallization layers 14 and 24. This minimizes the chance of chemical reactions degrading the structure over time. These three layers each have a thickness ranging from about 5 to about 30 nm, preferably less than 15 nm with 10 nm being the preferred size. The thickness of these layers may vary with particular applications, but it is necessary that they be designed to cause the link material to become conductive as a voltage is applied from the second metal layer 24 to the first metal layer 14.

The various link insulator components are preferably deposited by using plasma-enhanced chemical vapor deposition (PECVD) rather than thermal growth or thermal chemical vapor deposition (CVD). PECVD is a highly controllable process and, since it is performed at a relatively low temperature, aluminum can be used as a first layer conductor, rather than conductors with a higher melting point such as polysilicon. Also, thermally grown oxides tend to be very robust so that even very thin layers require high programming voltages. The use of PECVD oxide and nitride layers allows the use of a thicker insulator layer, thereby reducing parasitic capacitances, while still retaining a low programming voltage.

Moreover, PECVD techniques permit control over the silicon content. In forming the link structures of the present invention, silicon-rich insulators have been found useful. In some applications, it may be preferable to deposit silicon-rich compositions with up to twice as much silicon as the normal ($SiO_2$ and $Si_3N_4$) stoichiometric formulae. For example, when silicon-rich compositions are desired, the oxide layers of the link compositions can be described by the formula: $SiO_x$, where x can range from about 1.5 to about 2.0, and the nitride layers can be described by the formula: $SiN_y$, where y can range from about 0.32 to about 1.3.

Following the deposition of the transformable insulator link structure is the deposition of the thin film of conductive material 20. The conductive material is preferably aluminum, but may be a sandwich of aluminum and titanium or molybdenum or amorphous or polycrystalline silicon. The thin aluminum layer serves as a base pad for the second metal layer 24 and as an etch stop and need not be thicker than about 10 nm. Instead of etching the aluminum layer as in U.S patent application Ser. No. 07/860,678, ion implantation is used to delineate the patches of nonconductive and conductive regions. The conductive regions serve to link the first and second metal layers and the nonconductive regions serve to isolate the links. In the present invention, either nitrogen or oxygen ions are implanted in the aluminum surface, yielding aluminum nitride (AlN) or alumina ($Al_2O_3$) regions, respectively. The aluminum nitride and alumina patches are nonconductive while regions of the conductive layer 20 that were not ion implanted remain conductive.

Once the deposited aluminum layer 20 is implanted with nitrogen or oxygen ions, the interlevel dielectric material 22 is then deposited over the entire ion implanted aluminum surface. Then, a portion of the dielectric material is etched away leaving a window over the conductive patch. The etched window is then filled with the second metal layer 24. An electrical path is formed between the first and second conductive elements at selected patches by applying a voltage therebetween across the insulator. The insulator is then transformed into a conductive state to form an electrical signal path.

Figure 2A:
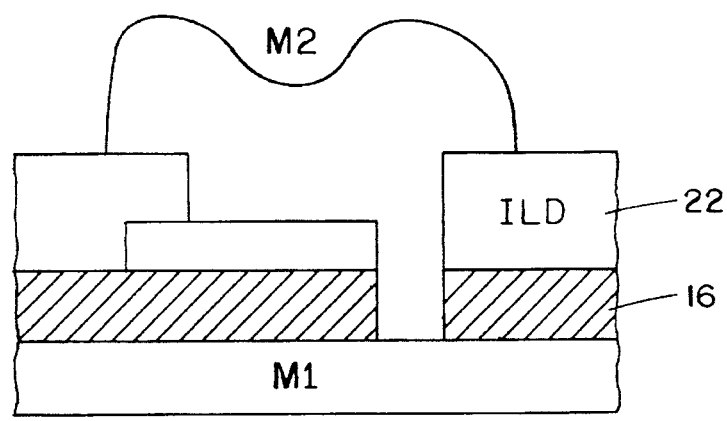
FIGS. 2A–2B show a sectional view comparison of the voltage programmable links of the present invention to the prior art.
Figure 2B:
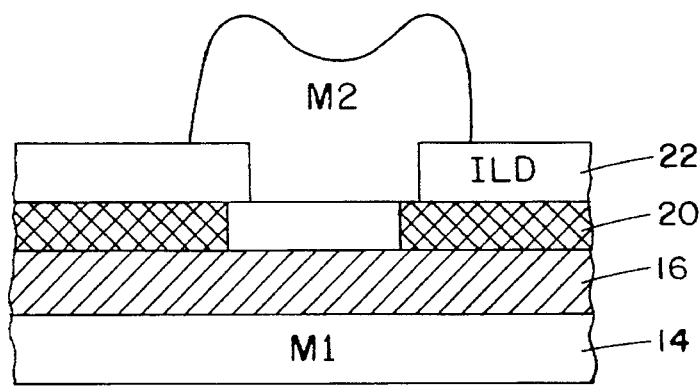

A comparison of the voltage programmable structure of U.S. patent application, Ser. No. 07/918,586 and the present invention is shown in FIGS. 2A and 2B. FIG. 2A shows the voltage programmable link structure of U.S. patent application, Ser. No. 07/918,586 and FIG. 2B shows the ion implanted programmable link structure of the present invention. In FIG. 2A the first metal and the second metal layer are misaligned. With misalignment, the patch does not provide a full etch stop with etching of the dielectric layer 22, so the etchant cuts a hole through the insulator layer 16 and causes a short between the first and second metal layers. To prevent a short from occurring, the patch must be designed to be considerably larger as highlighted in dashed lines. Increased patch size reduces density of the overall circuit. As mentioned earlier, the increase in patch size causes an increase in parasitic capacitance, which seriously degrades the performance of the structure. On the other hand, the parasitic capacitance and misalignment problems are not present in the present invention because ion implantation is used. The continuous layer of nonconductive and conductive regions serves as a continuous etch stop. In the present invention, as long as adequate contact is available between the conductive patch and the remainder of the second conductive metal the reliability of the link is assured. Indeed, even in a case of gross misalignment where some increase in the capacitance will invariably take place, this increase will be minimal since the insulator outside the conductive patch region is thicker now.

Figure 3A:
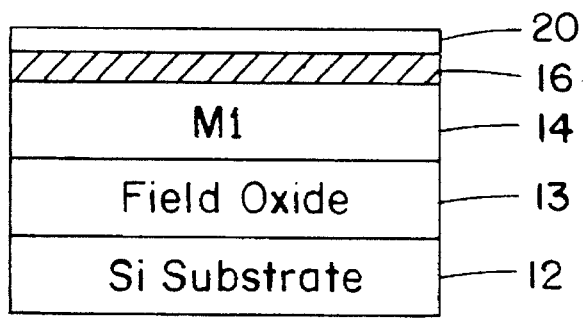
FIGS. 3A–3I illustrate a schematic method of fabricating a voltage programmable link structure according to the present invention.
Figure 3B:
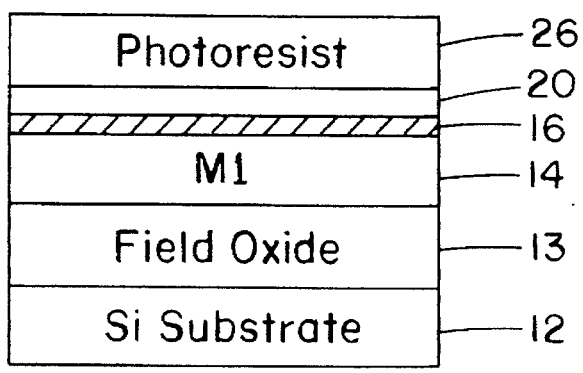

The voltage programmable link structure 10 is formed in the manner illustrated in FIGS. 3A–3I. The specific processing conditions and dimensions serve to illustrate the present method but can be varied depending upon the materials used and the desired application and device geometry. First, as shown in FIG. 3A, a field oxide layer 13 is deposited over a silicon substrate 12. Then the first metal layer 14 is deposited over the field oxide layer. Then, the transformable insulator material 16 is deposited over the first metal layer 14. A thin film of a conductive layer (i.e., aluminum) 20 is then deposited over the insulator. It may be advantageous to follow the deposition of the thin aluminum film with the deposition of a similarly thin film of silicon oxide. The silicon oxide layer serves as a protecting layer between the thin aluminum film and a photoresist material that is used for masking the ion implantation. Significantly, the oxide layer in the nonmasked areas prevents sputtering of the aluminum layer during the ion implantation process.

Figure 3C:
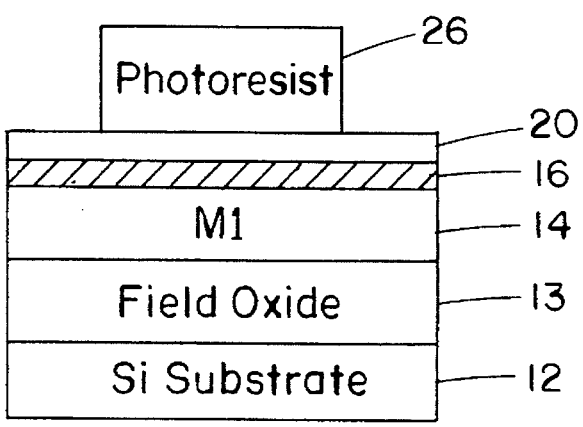

Once the aluminum layer 20 is deposited, a photoresist 26 is spray or spincoated (FIG. 3B) thereover. The photoresist is baked at a predetermined temperature usually between 50C–150C to fix the photoresist. Next a mask is disposed over the photoresist and the resist is exposed to light. The exposed areas of the photoresist are then washed away with a suitable solvent, such as a photoresist developer. The resulting structure is shown in FIG. 3C and is used as a mask for the ion implantation. The size of the photoresist determines the size of patch 18 which is used to connect the first and second metallization layers. As the size of the patch increases so does the parasitic capacitance. Thus, it is necessary to maintain a small patch size. Preferably, the patch 18 should be about 1.0µ in width. This particular size reduces the effects of parasitic capacitance and consistently causes the structure to breakdown at a programming voltage of 10 volts. However, the patch can be made smaller if desired. The breakdown voltage can also be varied by changing the insulator thickness which also minimizes parasitic capacitance.

Figure 3D:
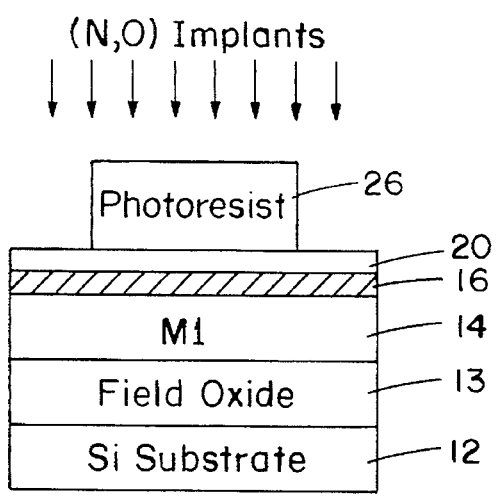
Figure 3E:
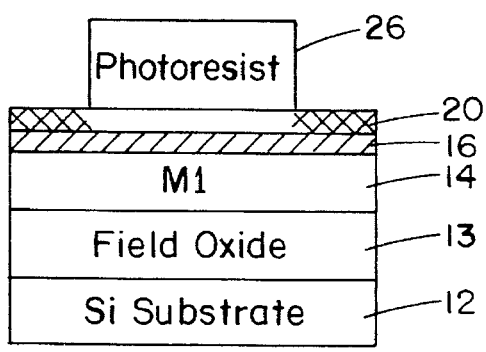
Figure 3F:
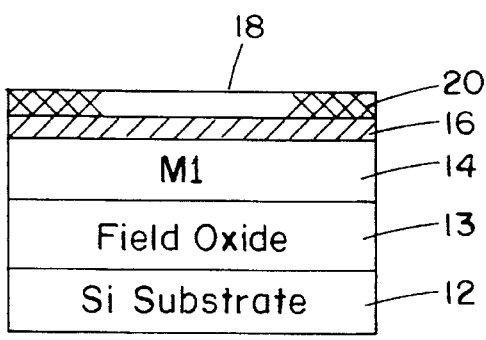

FIGS. 3D–3E show the photoresist acting as a mask as the thin aluminum layer 20 is implanted with either nitrogen or oxygen ions. After the thin aluminum layer 20 has been ion implanted, the photoresist is then washed away with a suitable solvent, such as a photoresist developer (FIG. 3F). After the photoresist is removed, there is a thin film aluminum surface patched with either nitrogen or oxygen, resulting in aluminum nitride (AlN) or alumina ($Al_2O_3$), respectively. The regions of aluminum nitride and alumina are nonconductive, whereas the region that was masked from the ion implantation is conductive. The patched surfaces are desirable because they form a continuous etch stop that is very difficult to etch. The use of nitrogen or oxygen for implantation into aluminum creates a coating which is very resistant to corrosion. This property is important in opening a contact hole for the interlevel dielectric 22.

Figure 3G:
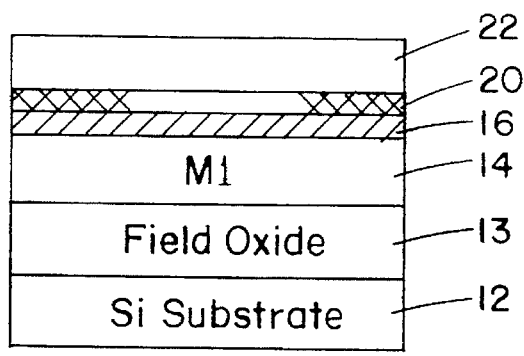
Figure 3H:
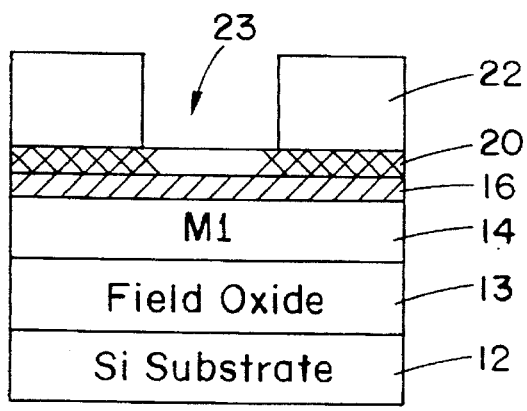

After delineating the thin patch, the interlevel dielectric 22 is then deposited over the entire aluminum patched surface and etched away in the region of the link forming a window 23 (FIGS. 3G–3H). The thin aluminum layer acts as an etch stop to protect the transformable link from etching.

Figure 3I:
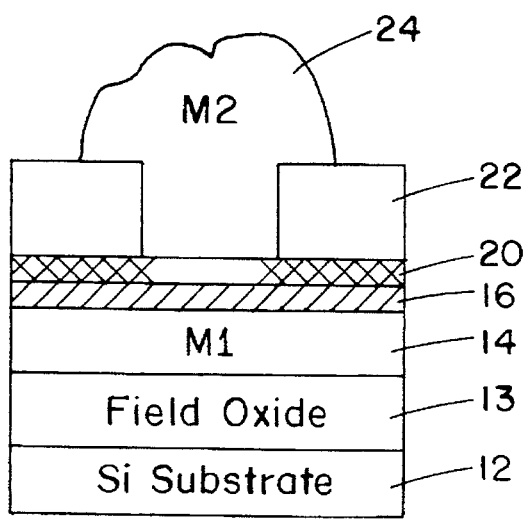

After etching the dielectric material, the etched window is then filled with the second conductive material 24 (e.g., aluminum, modified aluminum or a bulk refractive conductor, FIG. 3I). Conductive links are formed by the application of a predetermined voltage, typically greater than seven volts but less than 15 volts, preferably on the order of about 7.5 to about 12.5 volts, and most preferably on the order of about 8.5 to about 10.5 volts. The application of this voltage results in localized dielectric break down and formation of a conductive path.

Figure 4:
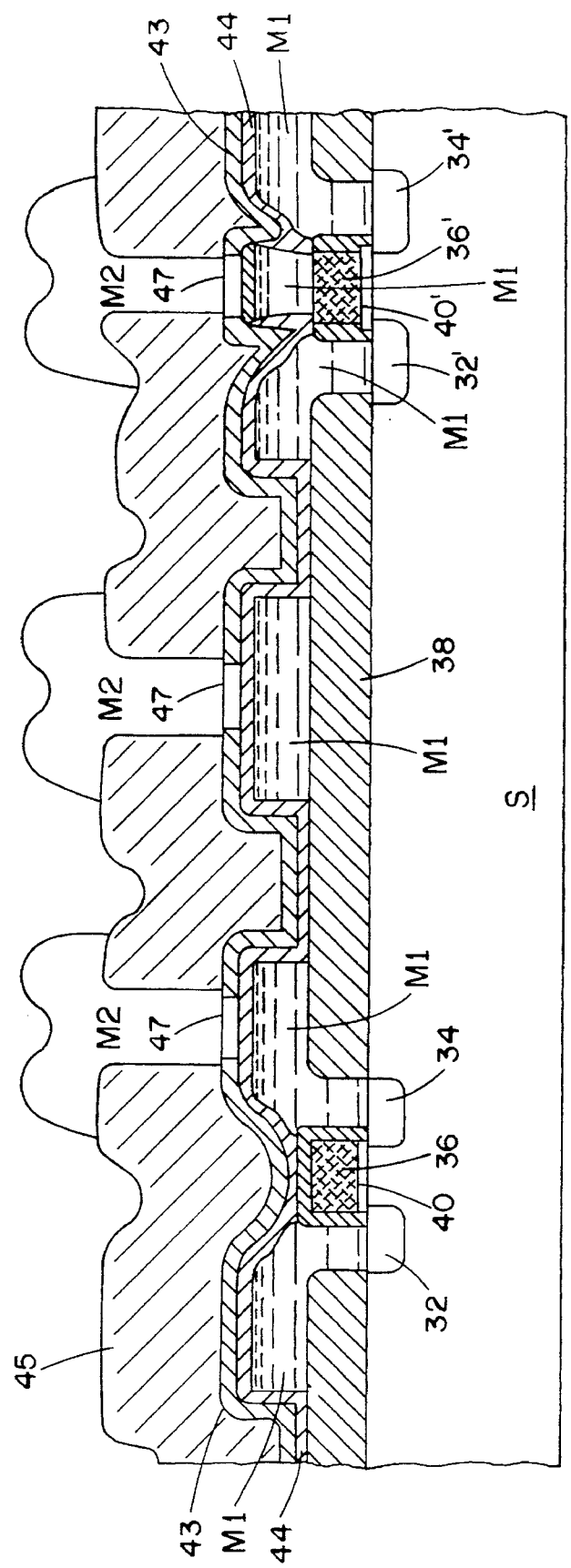
FIG. 4 is a sectional view of an integrated circuit showing a plurality of voltage programmable link structures according to the present invention.

FIG. 4 is a sectional view of an integrated circuit 30 showing a plurality of programmable link structures in accordance with the invention. In circuit 30, a number of active devices are formed upon a substrate S. For example, on the left side of the illustration, a transistor is shown comprising source 32, drain 34 and gate 36. The components of this active device are isolated from the other structures of the wafer by a thick oxide layer 38 (and a thinner gate oxide 40 in the vicinity of the transistor gate 36). The formation of such active devices is well known in the art. Another transistor having a similar source, drain and gate elements 32', 34' and 36', respectively, is shown at the right side of FIG. 4.

First metallization layer M1 is deposited in order to interconnect various active device elements on circuit 30. For example, on the left side of the illustration, the conductor layer M1 provides electrical connections to the source 32 and drain 34. Metallization layer M1 provides electrical contact with polysilicon gate region 36' as shown on the right side of the figure. In accordance with the present invention, metallization layer M1 comprises a refractory conductive material, composite, or modified aluminum, as described above, which substantially reduces the hillock-induced defects associated with aluminum-based structures. Layer M1 further includes a non-refractory top coating as described above.

A decomposable insulator 44 is deposited according to the present invention. The decomposable insulator 44 comprises a three-part deposited sandwich, as described above, comprising a first silicon nitride layer, a middle silicon oxide layer and upper silicon nitride layer. These three layers each have thicknesses ranging from about 3 to 30 nm, preferably less than 15 nm. For example, each of the three layers of the link structure 20 are about 10 nm thick. After depositing the insulator 44, an aluminum layer 43 is deposited thereon and ion implanted to form conductive patches 47 within nonconductive isolating regions. Following the ion implantation of the aluminum layer is the deposition of dielectric 45. A portion of the dielectric is removed to expose the conductive patches of the aluminum layer. Following the deposition of the dielectric material, a second (upper) metallization layer M2 is deposited to form another set of interconnects, again as described above.

Link structure 50, as shown in FIG. 4, permits an electrically programmable link to be formed between upper metal layer M2, lower layer M1 and transistor drain 34. Similarly, link structure 60 permits the formation of a link between layers M2 and M1 (in which the M1 line is electrically connected to another device element not shown in the sectional plane of FIG. 4). Link structure 70 permits the formation of a link between M2, M1 and the gate 36' of the transistor shown on the right side of the figure.

While the present invention has been particularly described in conjunction with a preferred embodiment and method of use, it will be understood that it is not intended to limit the invention to this embodiment. Instead, it is intended to cover all alternatives, modifications, and variations which will be apparent to those skilled in the art without departing from the spirit and scope of the present invention as defined by the appended claims.

For example, the term "aluminum" as used herein is intended to encompass not only pure aluminum but also various aluminum alloys, including AlSi, AlSiCu, AlCu, AlTi, AlCuCr and the like which are known and used routinely in the semiconductor industry.

Also, the terms "first" and "second" metallization layers are used herein to distinguish between lower and upper metallization lines. It should be clear that the "first" metallization line need not be the first or lowest conductive path in the integrated circuit. Likewise, the "second" layer need not be the only other metallization layer. There may be other metallization layers that do not enter into the programmable link.

Moreover, the invention can be practiced to establish links between more than two conductive layers, the term "first" and "second" being merely shorthand expressions for the bottom and top of the conductive path, respectively. Likewise, the term "substrate" is used herein to describe various layers which may lie below the "first" metallization layer, including the bulk silicon of the wafer, active devices (e.g., sources, gates and/or drain regions), gate oxide layers, and other structures as the case may be. Finally, it should be appreciated that the link structures and methods of the present invention need not be limited to silicon-based devices, but rather can also find applications in other semiconductor devices, such as gallium arsenide structures and the like.

The ion implantation need only be performed in a region surrounding the conductive patch sufficient to electrically isolate the patch and avoid alignment problems. Beyond that ion implanted region the layer may be etched so as not to remain a continuous layer across the entire surface. ion implanted region the layer may be etched so as not to remain a continuous layer across the entire surface.

I claim:

1. An electrically programmable link structure comprising:

a first conductive element;

a transformable insulator material over the first conductive element;

a layer of etch stop material over the transformable insulator material, the layer of etch stop material having conductive patches of the etch stop material within nonconductive regions of the etch stop material; and a second conductive element over the layer of etch stop material, wherein at least one conductive path at a link site is formable through the transformable insulator material by applying a voltage between the first and second conductive elements across the conductive patches of the etch stop material and the transformable insulator material.

2. An electrically programmable link structure according to claim 1, wherein the layer of etch stop material is an aluminum layer implanted with oxygen ions to form regions of alumina ($Al_2O_3$), the alumina regions being nonconductive.

3. An electrically programmable link structure according to claim 1, wherein the layer of etch stop material is an aluminum layer implanted with nitrogen ions to form regions of aluminum nitride (AlN), the aluminum nitride being nonconductive.

4. An electrically programmable link structure according to claim 1 wherein the etch stop material is amorphous or polycrystalline silicon.

5. An electrically programmable link structure according to claim 1, further comprising a dielectric material deposited over a portion of the layer of etch stop material, holes being formed therein through which the second conductive element is deposited.

6. An electrically programmable link structure according to claim 1, wherein the transformable insulator material comprises silicon oxide.

7. An electrically programmable link structure according to claim 1, wherein the transformable insulator material comprises silicon nitride.

8. The structure of claim 1 wherein the transformable insulator material is a multilayer structure comprising at least one silicon oxide layer and at least one silicon nitride layer.

9. An electrically programmable link structure comprising:

a first conductive element;

a transformable insulator material over the first conductive element;

an aluminum layer over the transformable insulator material, the aluminum layer having conductive patches within modified nonconductive regions of the aluminum layer;

a dielectric material over a portion of the aluminum layer; and a second conductive element over the aluminum layer and the dielectric material, wherein at least one conductive path at a link site is formable through the transformable insulator material by applying a voltage between the first and second conductive elements across the conductive patches of the aluminum layer and the transformable insulator material.

10. An electrically programmable link structure according to claim 9, wherein the aluminum layer is implanted with oxygen ions to form nonconductive regions of alumina ($Al_2O_3$).

11. An electrically programmable link structure according to claim 9, wherein the aluminum layer is implanted with nitrogen ions to form nonconductive regions of aluminum nitride (AlN).

12. An electrically programmable link structure comprising:

a first conductive element;

a transformable insulator material over the first conductive element;

an aluminum layer over the transformable insulator, the aluminum layer being modified to form nonconductive regions of alumina ($Al_2O_3$) in the aluminum layer about conductive patches of aluminum in the aluminum layer; and a second conductive element over the aluminum layer, wherein at least one conductive path at a link site is formed through the transformable insulator material by applying a voltage between the first and second conductive elements across the conductive patches of the aluminum layer and the transformable insulator material.

13. An electrically programmable link structure comprising:

a first conductive element;

a transformable insulator material over the first conductive element;

an aluminum layer over the transformable insulator material, the aluminum layer being modified to form nonconductive regions of aluminum nitride (AlN) in the aluminum layer about conductive patches of aluminum in the aluminum layer; and a second conductive element over the aluminum layer, wherein at least one conductive path at a link site is formed through the transformable insulator material by applying a voltage between the first and second conductive elements across the conductive patches of the aluminum layer and the transformable insulator material.

* * * * *